United States Patent

Murakami

[11] Patent Number: 6,133,066
[45] Date of Patent: Oct. 17, 2000

[54] SEMICONDUCTOR ELEMENT MOUNTING METHOD

[75] Inventor: Tomoo Murakami, Tokyo, Japan

[73] Assignee: NEC Corporation, Tokyo, Japan

[21] Appl. No.: 09/299,906

[22] Filed: Apr. 28, 1999

Related U.S. Application Data

[62] Division of application No. 08/902,108, Jul. 29, 1997, abandoned.

[30] Foreign Application Priority Data

Aug. 1, 1996 [JP] Japan .................................. 8-203891

[51] Int. Cl.[7] ...................................................... H01L 21/50
[52] U.S. Cl. ........................................... 438/108; 438/118
[58] Field of Search ..................................... 438/107, 106, 438/108, 118

[56] References Cited

U.S. PATENT DOCUMENTS

Re. 35,119  12/1995  Blonder et al. .
4,151,543   4/1979   Hayakawa et al. .
4,786,545  11/1988   Sakuma et al. .

FOREIGN PATENT DOCUMENTS 4-82241  3/1992  Japan .

Primary Examiner—Tuan H. Nguyen
Assistant Examiner—Evan Pert
Attorney, Agent, or Firm—McGinn & Gibb, P.C.

[57] ABSTRACT

A method of mounting a semiconductor element on a substrate and a semiconductor device formed therewith, includes forming mounting pads on the substrate, roughening a surface of at least one of the pads, positioning a resin between a semiconductor element having electrodes formed thereon and the substrate, and connecting roughened surfaces of the pads to the electrodes, respectively.

7 Claims, 4 Drawing Sheets

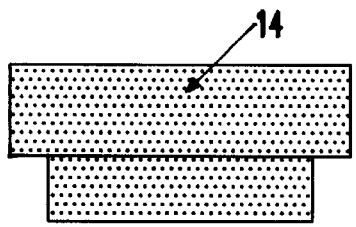
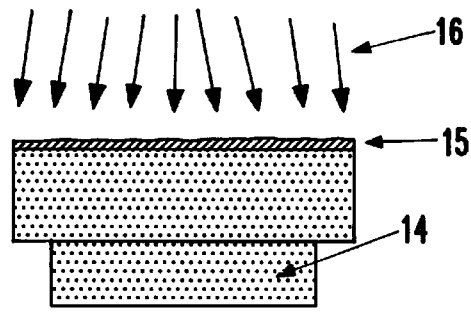
FIG.4A
FIG.4C
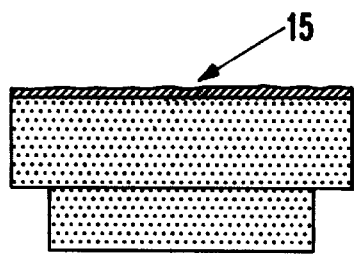
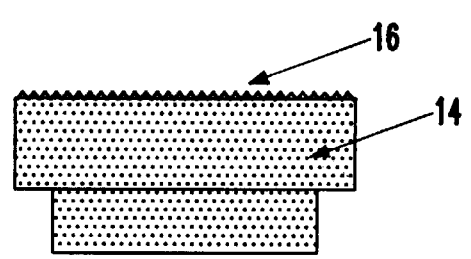
FIG.4B
FIG.4D
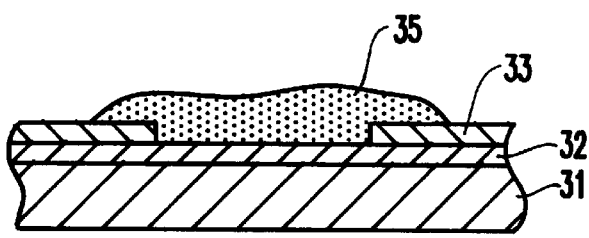
FIG.5A
PRIOR ART
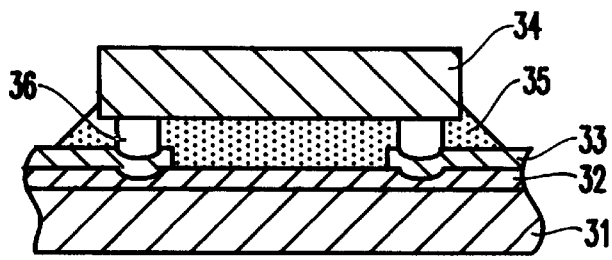
FIG.5B
PRIOR ART

SEMICONDUCTOR ELEMENT MOUNTING METHOD

This application is a divisional application of U.S. patent application Ser. No. 08/902,108 filed Jul. 29, 1997 (now abandoned).

BACKGROUND OF THE INVENTION

1. Field of the Invention

The present invention relates to a semiconductor element mounting method and a semiconductor device and, more particularly, to a flip-chip mounting method for mounting a semiconductor element on a substrate and the device formed thereby.

2. Description of the Related Art

Recently, with miniaturization and price reduction of electronic equipment, structures for mounting a semiconductor element on a substrate at a high density have been simplified. One method that has been employed is a so-called "flip-chip mounting method" as a semiconductor element high-density mounting structure having such a simplified structure.

In the flip-chip mounting method which is disclosed, for example, in Japanese Unexamined Patent Publication No. Hei. 4-82241, a semiconductor element is mounted with a plurality of bump electrodes on at least one of its surfaces, and is connected to a circuit board with the surface (e.g., having the bump electrodes) placed downwardly.

A conventional flip-chip mounting structure will be described with reference to FIGS. 5(a) and 5(b), which illustrate the same structure disclosed in FIGS. 1A and 1C of JPA 4-82241.

An insulative resin layer 32 made of a material capable of elastic recovery, such as rubber, is formed on a circuit board 31. Mounting pads 33 also are formed on the insulative resin layer 32 by sputtering or evaporation. A sealing resin 35 is applied to a region of the insulative resin layer 32 through which a semiconductor element 34 is to be fixed to the board 31. A plurality of bump electrodes 36 are formed on a surface of the semiconductor element 34 on the board 31 side.

The plurality of bump electrodes 36 provided on the bottom surface of the semiconductor element 34 are aligned with the mounting pads 33 on the board 31. Then, the semiconductor element 34 is brought into pressurized contact with the board 31 (e.g., element 34 and board 31 are pressed together), whereupon the sealing resin 35 between the bump electrodes 36 of the semiconductor element 34 and the mounting pads 33 on the board 31 is squeezed outwardly (e.g., extruded). The sealing resin extrusion causes the bump electrodes 36 and the mounting pads 33 to become connected together electrically.

In the conventional flip-chip mounting structure illustrated in FIGS. 5(a) and 5(b), the electrical connection between the bump electrodes 36 and the mounting pads 33 is maintained stably due to the elastic recovery property (force) of the insulative resin layer 32 and the contraction force of the sealing resin 35.

However, in the conventional flip-chip mounting structure, the elastic recovery force of the insulative resin layer and the contraction force of the sealing resin weaken over time, as shown in a time acceleration test, such as a temperature cycle test. This is a problem.

Specifically, sometimes the thermal expansion may exceed the contraction force and the elastic recovery force of the insulative resin layer, so that openings or gaps are formed between the bump electrodes and the mounting pads. These gaps may cause a connection failure between the semiconductor element and the board. This produces defective devices, which results in costly and time-consuming repairs and/or waste.

Further, in the above conventional flip-chip mounting structure, when the semiconductor element 34 is connected to the board 31, the mounting pads 33 and the insulative resin layer 32 are sometimes elastically deformed. When the balance between the contraction force of the sealing resin 35 and the elastic recovery force of the insulative resin layer 32 changes due to temperature variation (e.g., the contraction force of the sealing resin 35 becomes greater or less than the elastic recovery force of layer 32), the deformation state of the mounting pads changes accordingly. Hence, considerable stress may be exerted on the mounting pads 33 due to temperature variation, possibly damaging the mounting pads 33 and their connections, thereby causing a disconnection.

Another problem is that a special resin layer (e.g., such as rubber or the like) is required for bonding, thereby requiring an additional manufacturing step and resulting in a more complex manufacturing method and device.

SUMMARY OF THE INVENTION

In view of the foregoing and other problems of the conventional devices and methods, it is an object of the present invention to provide an improved method and semiconductor device for overcoming the above-mentioned drawbacks.

Another object is to provide an improved method and semiconductor device in which the mounting pads and their connections are maintained over time.

In a first aspect, a method and semiconductor device according to the present invention and formed by mounting a semiconductor element on a substrate, includes forming pads on the substrate, roughening a surface of at least one pad of the pads, positioning a resin on the substrate, positioning a semiconductor element having electrodes on the resin, the electrodes facing the substrate, and connecting roughened surfaces of the pads to respective ones of the electrodes.

In another aspect of the invention, a semiconductor element mounting method includes steps of roughening a surface of at least one mounting pad on a substrate, supplying a sealing resin to the substrate, connecting electrodes formed on the semiconductor element to roughened surfaces of the mounting pads, and curing the sealing resin.

In a third aspect of the invention, at least one surface of a mounting pad of the semiconductor element is roughened by a stamper tool.

With the invention, the above-mentioned drawbacks are overcome, and the mounting pads and their connections are maintained over time.

Additionally, unlike the conventional device and method described above, the structure and method of the present invention do not require a special insulative resin layer, thereby resulting in a smaller structure, less manufacturing steps, and greater efficiency.

BRIEF DESCRIPTION OF THE DRAWINGS

The foregoing and other objects, aspects and advantages will be better understood from the following detailed description of preferred embodiments of the invention with reference to the drawings, in which:

FIGS. 4(a) through 4(d) are schematic illustrations of sectional views showing how to make a stamper tool according to the present invention; and FIGS. 5(a) through 5(b) are sectional views showing a conventional mounting method of a semiconductor device.

DETAILED DESCRIPTION OF PREFERRED EMBODIMENTS OF THE INVENTION

FIGS. 1(a)–1(h) are sectional views illustrating a mounting method according to a first embodiment of the invention and a resulting structure of a semiconductor device formed by the method.

Figure 1A:
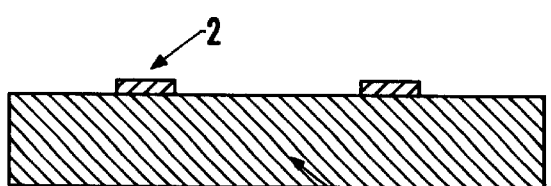
FIGS. 1(a) through 1(h) are schematic illustrations of sectional views showing a mounting method of a semiconductor element according to a first embodiment of the present invention.

More specifically, referring to FIG. 1(a), mounting pads 2 are formed on a circuit board 1. It is noted that there is no specific limitation imposed on the type of base material of the circuit board 1. For example, it may be a printed wiring board whose base material is an epoxy material. Similarly, the mounting pads 2 are preferably formed of copper, for example, but may be formed of other metallic substances providing good conduction.

Figure 1E:
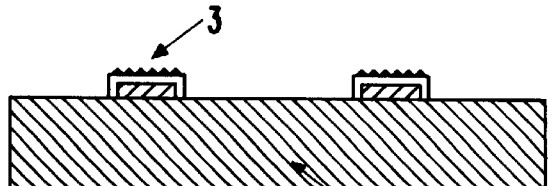
Figure 1B:
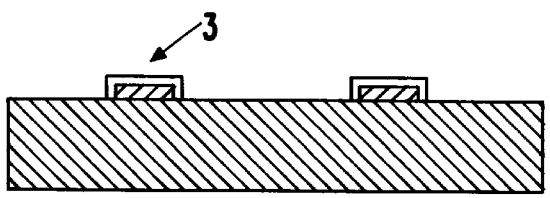

Referring to FIG. 1(b), electroless nickel platings 3 are applied to the mounting pads 2 formed on the circuit board 1. While there is no specific limitation as to the thickness of the plating 3, the thickness may be in a range of approximately 3 $\mu$m to 8 $\mu$m, and more preferably approximately 5 $\mu$m.

Figure 1F:
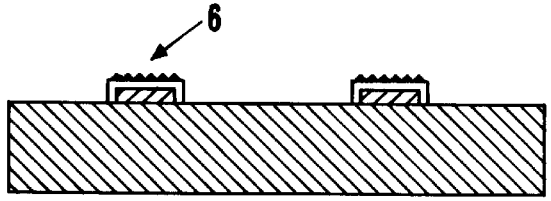
Figure 1C:
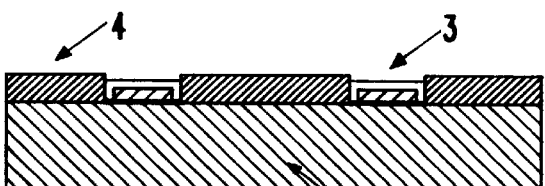

Next, as shown in FIG. 1(c), a protective resist 4 is formed on the circuit board 1, but is not formed on the mounting pads 2 to which the nickel plating 3 has been applied. The protective resist 4 protects the regions other than the nickel platings 3, so that the circuit board is not damaged in the next step of sandblasting the nickel platings 3. No specific limitations are imposed on the material, thickness, etc. of the protective resist 4. For example, the protective resist may preferably be in a range of approximately 20 $\mu$m to 60 $\mu$m, and more preferably may be an approximately 40-$\mu$m-thick epoxy resin film, and may comprise, for example, photo-imageable acrylic resin (e.g., dry-type film).

Figure 1G:
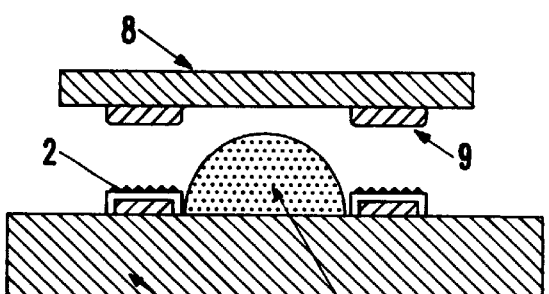
Figure 1D:
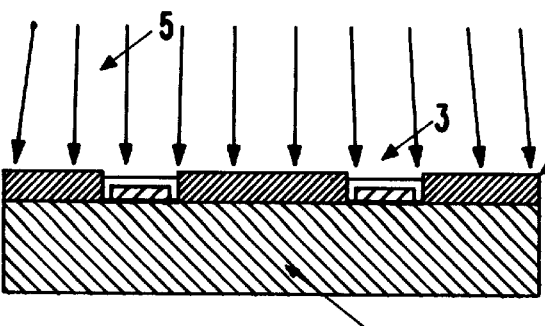
Figure 1H:
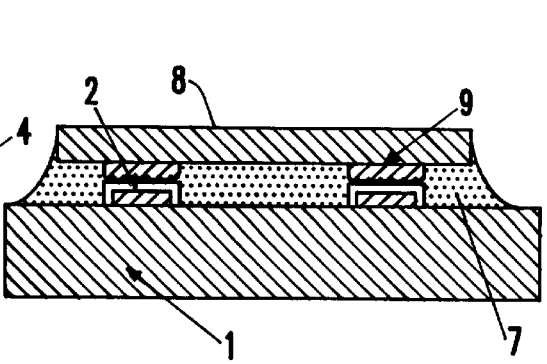
Figure 2A:
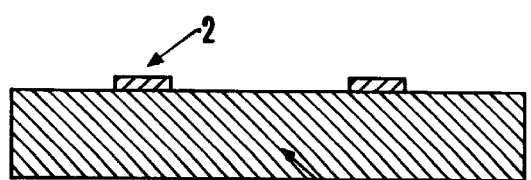
FIGS. 2(a) through 2(g) are schematic illustrations of sectional views showing a mounting method of a semiconductor element according to a second embodiment of the invention.
Figure 2E:
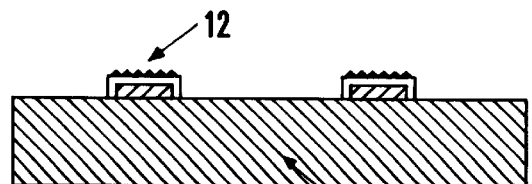
Figure 2B:
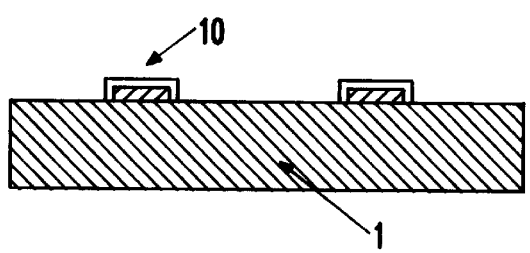
Figure 2F:
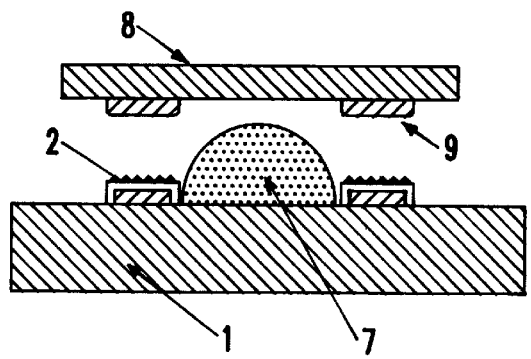
Figure 2C:
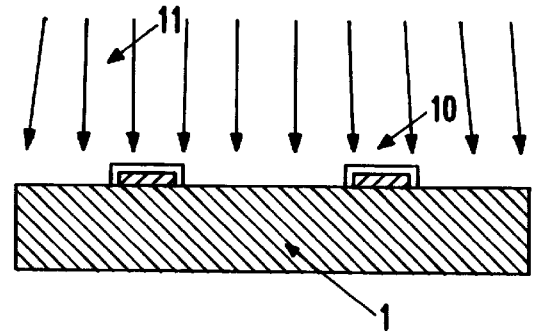
Figure 2G:
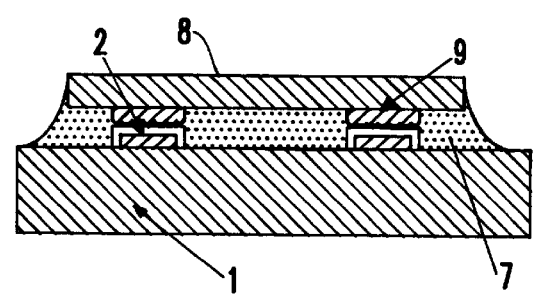
Figure 2D:
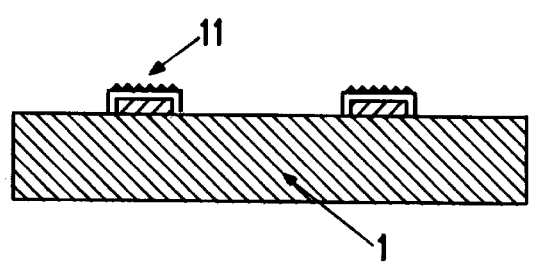
Figure 3A:
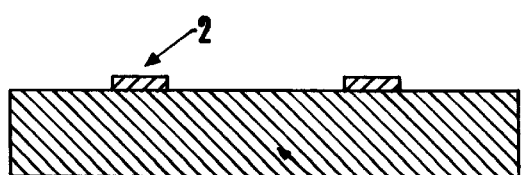
FIGS. 3(a) through 3(h) are schematic illustrations of sectional views showing a mounting method of a semiconductor element in which a stamper tool is used in forming a roughened surface on a pad of the semiconductor element according to the present invention.
Figure 3E:
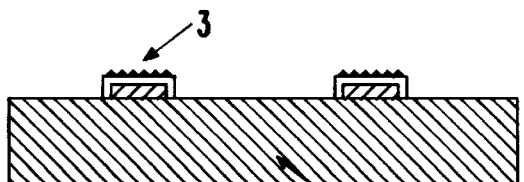
Figure 3B:
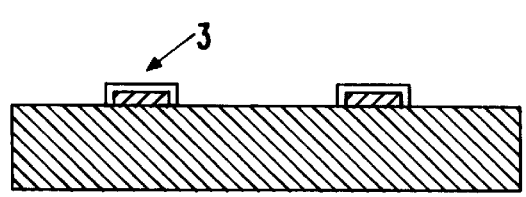
Figure 3F:
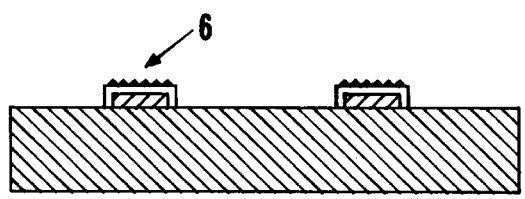
Figure 3C:
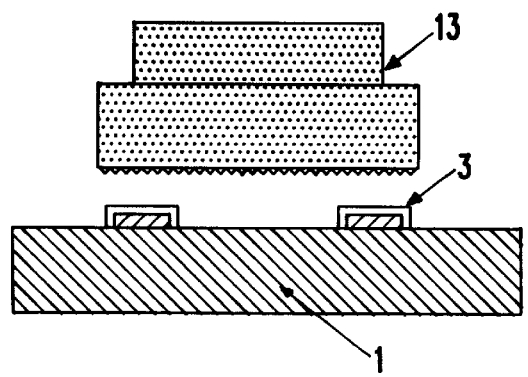
Figure 3G:
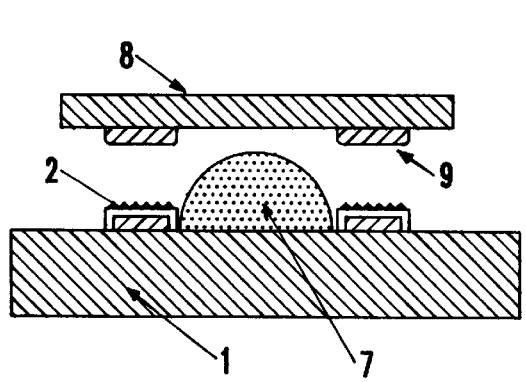
Figure 3D:
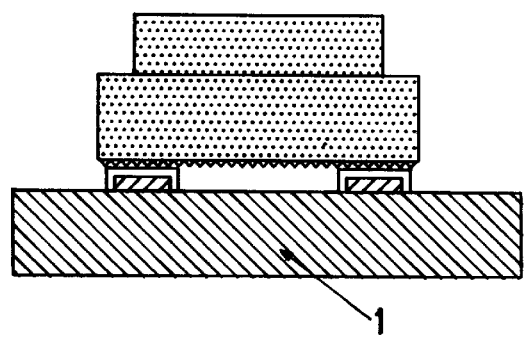
Figure 3H:
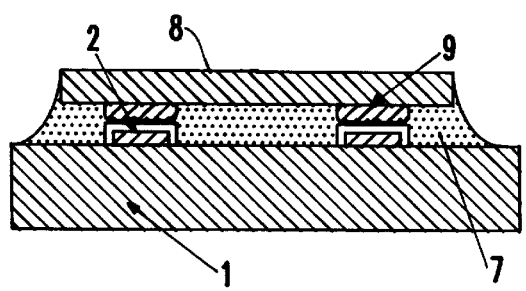

Next, as shown in FIG. 1(d), substantially the entire surface of the circuit board 1 on which the protective resist 4 is formed, is roughened. For example, sandblasting 5 may be performed for roughening, whereby at least one surface (e.g., top and/or side surfaces) of each of the mounting pads 2 are roughened. That is, sand grains are blown against the entire surface of the circuit board 1 to form a coarse surface.

Additionally, while sandblasting/roughening is shown in the Figures for every mounting pad, it would also be feasible to sandblast (or roughen) surfaces of only some of the pads (e.g., at least one of the pads or every other pad). Of course, preferably all mounting pads have at least one surface (e.g., the top surface and/or surfaces) for contacting a bump electrode as discussed below. Sand grains used for the sandblasting 5 may have such sizes (e.g., 5 $\mu$m to 50 $\mu$m) that the depth of abrasions of the roughened surfaces fall within a range of approximately 2.5 $\mu$m to 25 $\mu$m, and more preferably become 3–4 $\mu$m.

As mentioned above, while sandblasting is used in the example illustrated in FIGS. 1(a)–1(h), another abrasive method could be used to roughen the surface of the pads. For example, in the third embodiment of the present invention as described below, mechanical roughening may be employed by use of a special tool such as a stamper tool 13 having diamond particles 16 (e.g., preferably having a diameter of between 5 and 25 $\mu$m) used to punch (e.g., stamp) the surface of the pads, as shown in FIGS. 3(a)–3(h) and 4(a)–4(d).

Generally, it is believed that a chemical roughening process (e.g., etching or the like) is not preferable since the surface is too fine. Additionally, as mentioned above, it is possible/feasible to sandblast (or roughen) surfaces of less than all of the pads (e.g., every other pad) or at least one of the pads.

Then, the sandblasted circuit board 1 is subjected to ultrasonic cleaning, and the protective resist is peeled off the circuit board 1. For example, a high pressure water cleaner (e.g., like a shower) can be employed or various rolling brush (with water) cleaning methods can be used.

Sand grains blown against the surface of the circuit board 1 in the preceding step may be buried in the mounting pads 2 to which the nickel platings 3 are applied. Thus, ultrasonic cleaning is necessary to remove the buried sand grains since otherwise possible defects and/or faulty operations may be encountered in the structure as a result of the embedded grains. The protective resist 4 is removed by any conventional technique known to those ordinarily skilled in this art field.

As shown in FIG. 1(e), after completion of the sandblasting step, the mounting pads 2 to which the nickel platings 3 are applied and to whose surfaces are roughened are the only structures left on the circuit board 1.

Next, as shown in FIG. 1(f), thin electroless gold platings 6 are applied to the roughened nickel platings 3 by any conventional technique known to those ordinarily skilled in the art such as chemical plating, to make gold mounting pads 2. In this embodiment, the gold platings should be thinner than the depth of abrasions of the roughened surfaces so as not to fill in the roughened surfaces of the nickel platings 3. For example, the thickness of the gold platings is preferably in a range of approximately 0.01 $\mu$m to 0.05 $\mu$m, and more preferably is approximately 0.03 $\mu$m. Thus, gold mounting pads with roughened surfaces (e.g., formed with abrasions) are formed on the circuit board 1.

Next, as shown in FIG. 1(g), a sealing resin 7 is supplied to a mounting portion on the circuit board 1. The method for supplying the sealing resin 7 may be one of various methods known by those ordinarily skilled in the art, such as a screen printing method or a dispenser supply method.

A thermosetting (e.g., fast-setting epoxy resin) whose curing shrinkage rate is larger than its thermal expansion coefficient is used as the sealing resin 7. For example, in the preferred embodiment, a resin that is completely cured by heating at 270° C. for about 30 seconds, such as a modified epoxy resin in an amine-cured system, is used as the sealing resin 7.

Since a resin whose curing shrinkage rate is larger than its thermal expansion coefficient is used as the sealing resin, a stable connection is maintained, even in a high-temperature environment, such as 125° C.

Bump electrodes 9 are formed on the circuit board side of the semiconductor element 8. The bump electrodes 9 of the semiconductor element 8 are aligned with the mounting pads 2 on the circuit board 1, and the sealing resin 7 is supplied to the circuit board 1. The semiconductor element 8 is connected to the circuit board 1 by applying pressure and heat as shown in FIG. 1(*h*). In this operation, the sealing resin 7 is cured by heating, for example, at a temperature of between 250° C. to 280° C.

The pressure is set high enough for the bump electrodes 9 to connect to the abrasions of the roughened surfaces of the mounting pads 2. For example, the pressure is preferably set at 30 g/bump electrode 9.

With regard to the heating, the temperature on the semiconductor element 8 side is preferably set to a value within a range of approximately 250° C. to 280° C., and more preferably to 270° C., and the temperature on the circuit board 1 side is set to a value within a range of approximately 60° C. to 100° C., and more preferably to 80° C., and the holding time is approximately 30 seconds. Such temperature and pressure are low enough so that the structures being joined will not be deformed.

Since a high connection strength is attained without deforming the mounting pads or other structures, the mounting pads and other structures can be joined together without being damaged.

In the above-described method of mounting a semiconductor element, the combination of the shrinkage force of the sealing resin and the mechanical connecting force of the bump electrodes and the abrasions firmly holds together the semiconductor element 8 and the circuit board 1. Therefore, with the inventive method and structure, a stable connection state can always be maintained.

Specifically, the abrasions create a greater holding force (e.g., a greater mechanical bonding) due to a so-called "anchor effect" by material being deposited on the surface of the pads and in such a deposition step into the abrasions (asperities) on the surface of the pads. For example, the abrasion may be formed of a cavity in which the diameter of the cavity is greater at the bottom thereof than at the top along the top plane of the surface of the pad, thereby providing the "anchor effect".

Second Embodiment

A second embodiment of the present invention will be described in detail with reference to FIGS. 2(*a*)–2(*g*) which are sectional views illustrating a second method of mounting a semiconductor element, and a semiconductor device formed thereby. The same elements discussed above with respect to FIGS. 1(*a*)–1(*h*) are identified with the same reference numerals in FIGS. 2(*a*)–2(*g*), for ease of understanding.

Referring more specifically to FIG. 2(*a*), mounting pads 2 are formed on a circuit board 1. The circuit board 1 and the mounting pads 2 are similar to those in the above-described first embodiment.

Referring to FIG. 2(*b*), metal pastes or conductive pastes such as copper, noble metals such as silver, gold, Palladium, etc. or aluminum may be used. However, while such pastes such as silver etc. may be used, such pastes are expensive (in relation to copper) even though their conductivity is approximately one-half that of copper. Thus, trade-offs are involved between expense and minimizing the degree of conductivity after curing.

Hence in the example below, copper pastes 10 will be used. First, copper pastes 10 are applied, for example by printing, to the mounting pads 2. As for the type of copper paste 10, a copper paste preferably has a conductivity after curing as low as possible, having a conductivity within a range of approximately 0.2 Ω/mm$^2$ to 0.6 Ω/mm$^2$. The diameter of copper particles in the copper pastes 10 should be as small as possible.

For example, the diameter is preferably within a range of approximately 1 μm to 10 μm, and more preferably is 5 μm on the average. Preferably, the coating thickness of the copper pastes is not more than 15 μm. For example, copper pastes having a coating thickness of approximately 13 μm are even more preferable, and can be formed by using a 20-μm-thick metal mask. There is no drawback in making the copper pastes have a thickness smaller than 13 μm. However, if the thickness is greater than 15 μm, then conductivity problems may arise due to the thickness of the copper pastes having a greater likelihood of being non-uniform.

Next, as shown in FIG. 2(*c*), a metal powder 11 is blown (e.g., in a manner the same or similar to that of the sandblasting of the first embodiment) against the copper pastes 10 that are applied to the mounting pads 2. For example, the metal powder may be a pulverization-type metal (e.g., a copper powder) having an average particle diameter in a range of 10 μm to 20 μm, and more preferably a diameter of about 15 μm.

Next, as shown in FIG. 2(*d*), the circuit board 1 is heated to cure the copper pastes 10, whereby the metal powder 11 is secured (e.g., connected) within the copper pastes 10. The copper pastes 10 are cured with an oven in accordance with their thermal characteristics. If a metal mask is used, cleaning is unnecessary since metal powder 11 is adhered only within the copper pastes 10. The metal powder 11 does not adhere to the region on the circuit board 1 where the copper pastes 10 are not applied. As mentioned above, it adheres only within the copper pastes. Thus, the metal powder is easily removed from the circuit board 1 by any conventional treatment, such as ultrasonic cleaning, after the copper pastes 10 have cured.

Next, as shown in FIG. 2(*e*), relatively thin electroless nickel-gold platings 12 are applied to the mounting pads 2 on whose surfaces the metal powder 11 remains. The nickel-gold platings are very thin, and for example the nickel platings are preferably within a range of 1 μm to 5 μm thick, and more preferably are 3-μm thick, whereas the gold platings are preferably within a range of 0.01 μm to 0.05 μm thick, and more preferably are 0.03-μm thick, respectively. The above-mentioned order of the deposition of the platings is preferable since gold-to-gold plating is desirable. Thus, nickel is preferably deposited first, followed by gold platings. The platings are made thin, so as not to bury the protrusions of the metal powder that adheres to the mounting pads 2.

Hence, the gold mounting pads having roughened surfaces can be formed on the circuit board 1. Therefore, the second embodiment is different from the first embodiment, in that the second embodiment forms a roughened surface by adding rough metal powder, whereas the first embodiment roughens the surface of the pads by using an abrasive substance, or an abrasive technique such as sandblasting or stamping.

Next, as shown in FIG. 2(*f*), a sealing resin 7, similar to that used in the first embodiment described above, is supplied to a mounting portion on the circuit board 1. The method for supplying the sealing resin 7 is preferably the same as the above-mentioned screen printing method, but also could be another similar method.

The bump electrodes 9 of the semiconductor element 8 are aligned with the mounting pads 2 on the circuit board 1, and the sealing resin 7 is supplied to the circuit board 1. It is noted that the bump alignment procedure is conventional and can be performed by a conventional flip-chip bonding machine. The semiconductor element 8 is connected to the circuit board 1 by applying pressure and heat, as shown in FIG. 2(*g*). In this operation, the sealing resin 7 is cured by heating. Here, the amount of pressure and the amount of heating can be set preferably the same as in the above first embodiment, for example.

As with the first embodiment, in the second embodiment of the invention, both the shrinkage force of the resin and the mechanical connecting force between the bump electrodes 9 and the abrasions of the roughened surfaces of the mounting pads 2 combine to provide a firm bond between the semiconductor element 8 and the circuit board 1. Therefore, with the invention, a stable connection can be maintained, even though temperature may vary.

As described above, according to the invention, the bump electrodes bond with the abrasions formed on the surfaces of the mounting pads. Therefore, a firm connection is made between the semiconductor element and the circuit board, not only by the connecting force due to the shrinkage rate of the sealing resin, but also by the mechanical connecting force (strength) of the bumps and the roughened pads. Therefore, the connection strength and the connection reliability is improved greatly over the conventional methods and structures.

Further, since a resin whose curing shrinkage rate is larger than its thermal expansion coefficient is used as the sealing resin, a stable connection is maintained even in a high-temperature environment.

Also, since a high connection strength is attained without deforming the mounting pads or other structures, the mounting pads and other structures are joined together without being damaged. Thus, the device has increased operability.

Third Embodiment

FIGS. 3(*a*)–3(*h*) are schematic illustrations of sectional views showing a mounting method of a semiconductor element according to a third embodiment of the present invention, in which a stamper tool 13 is used in forming a roughened surface on a pad of the semiconductor element. FIGS. 4(*a*)–4(*d*) are sectional views illustrating how to make the stamper tool 13.

For brevity, a description of the steps shown in FIG. 3(*a*) and FIG. 3(*b*) is omitted herein, since such steps are the same as those of FIG. 1(*a*) and FIG. 1(*b*), respectively, of the first embodiment.

Next, as shown in FIG. 3(*c*), a stamper tool 13 is aligned with the mounting pads 2 on the circuit board 1.

As shown in FIG. 3(*d*), the stamper tool 13 is pressed onto the mounting pads 2. There is no specific limitation imposed on the pressure of the stamper tool 13 against the mounting pads 2. For example, the pressure preferably may be in a range of approximately 20 to 40 grams/pad and more preferably 30 grams/pad.

As shown in FIG. 3(*e*), after completion of the stamping step, the mounting pads 2 having the nickel platings 3 thereon, have surfaces which are roughened.

For brevity, a description of the steps shown in FIG. 3(*f*)–FIG. 3(*h*) is omitted herein, since such steps are the same as those of FIGS. 1(*f*)–1(*h*) of the first embodiment.

Hereinbelow, a process for making the stamper tool 13 is described.

First, in FIG. 4(*a*), the base material 14 of the stamper tool 13 is made. For example, the base material 14 may be made by stainless steel, but of course other materials can be used. Thus, there is no limitation on the material for making the base material 14.

As shown in FIG. 4(*a*), the top surface of the base material 14 is substantially flat (e.g., planar).

Next, as shown in FIG. 4(*b*), the top surface of the base material 14 is coated by a heat-curing resin 15. The heat-curing resin 15 is not limited to a certain type, so long as there is some adhesive character/property of the resin before heating. For example, an epoxy-type resin may be used as the heat-curing resin 15 in the third embodiment.

As shown in FIG. 4(*c*), crushed diamond particles 16 are blown onto the top surface. The diameter of the particles 16 is not limited, but preferably the particle diameter is within a range of approximately 5 to 25 um.

Next, as shown in FIG. 4(*d*), the base material 14 is heated to cure the diamond particles 16, whereby the diamond particles 16 are secured with the heat-curing resin 15. The curing condition depends on the type of heat-curing resin 15 used. For example, the epoxy resin used exemplarily in the third embodiment was cured (e.g., completed to secure the diamond particles 16) in an oven at a temperature of substantially 120° C. for substantially one hour. As a result, the stamper tool 13 has 2.5 to 5.0 $\mu$m bumps on the top surface of the base material 14.

Thus, in the third embodiment of the present invention, a stamper tool 13 is employed to provide the roughened surfaces of the pads. Such a stamper tool may be employed alternatively to the sandblasting in the step of FIG. 1(*d*). Using such a tool in lieu of the sandblasting step (as in the first embodiment described above) to provide roughened surfaces of the pads is advantageous in that such a technique saves two steps in the manufacturing process. Specifically, the steps of depositing a resist and peeling off the resist is made unnecessary. Thus, a more efficient and less costly method are provided by using such a stamper tool to roughen the surfaces of the pads.

While the invention has been described with reference to the specific embodiments described above, it is not limited thereto and includes all variations which would be known to those ordinarily skilled in the art.

Having thus described my invention, what I claim as new and desire to secure by Letters Patent is as follows:

1. A method of mounting a semiconductor element on a substrate, comprising:

forming pads on said substrate;

mechanically roughening a surface of at least one pad of said pads;

positioning a resin on said substrate;

positioning a semiconductor element having electrodes on said resin, said electrodes facing said substrate; and connecting roughened surfaces of said pads to respective ones of said electrodes.

2. The method according to claim 1, wherein said roughening comprises sandblasting said surface of said at least one pad.

3. The method according to claim 1, wherein said roughening comprises stamping said surface of said at least one pad, thereby to form depressions on said surface.

4. The method according to claim 1, wherein said roughening comprises roughening a surface of each of said pads.

5. The method as in claim 1, wherein said roughening said surface of said at least one pad forms abrasions on said at least one pad, and wherein said method further comprises a covering said surface of said at least one pad with a material having a thickness less than a depth of said abrasions.

6. The method as in claim 1, wherein said material comprises gold plating, said forming said pads comprises forming nickel platings on said substrate, and said roughening comprises sandblasting said nickel platings.

7. The method as in claim 1, wherein said roughening said surface of said at least one pad comprises forming a conductive paste including a metal powder on said at least one pad, and said material comprises a nickel-gold plating.

\* \* \* \* \*